United States Patent
Roy et al.

(10) Patent No.: US 9,401,207 B2
(45) Date of Patent: Jul. 26, 2016

(54) PSEUDO SRAM USING RESISTIVE ELEMENTS FOR NON-VOLATILE STORAGE

(71) Applicant: FREESCALE SEMICONDUCTOR, INC., Austin, TX (US)

(72) Inventors: Anirban Roy, Austin, TX (US); Frank K. Baker, Jr., Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 37 days.

(21) Appl. No.: 14/568,467

(22) Filed: Dec. 12, 2014

(65) Prior Publication Data

US 2016/0172035 A1  Jun. 16, 2016

(51) Int. Cl.
| | | |
|---|---|---|
| G11C 11/00 | (2006.01) | |
| G11C 14/00 | (2006.01) | |
| G11C 5/10 | (2006.01) | |
| G11C 11/419 | (2006.01) | |
| G11C 13/00 | (2006.01) | |

(52) U.S. Cl.
CPC ............... *G11C 14/009* (2013.01); *G11C 5/10* (2013.01); *G11C 11/419* (2013.01); *G11C 13/0069* (2013.01)

(58) Field of Classification Search
CPC .. G11C 11/413; G11C 7/1051; G11C 7/1057; G11C 7/1078; G11C 7/1084; G11C 11/5642; G11C 16/0475; G11C 16/0483; G11C 16/3427; G11C 7/06
See application file for complete search history.

(56) References Cited

U.S. PATENT DOCUMENTS

| | | | |
|---|---|---|---|
| 6,097,629 A | 8/2000 | Dietrich et al. | |
| 6,556,487 B1 | 4/2003 | Ratnakumar et al. | |
| 7,054,194 B2 | 5/2006 | Liaw et al. | |
| 7,692,954 B2 * | 4/2010 | Lamorey | G11C 14/0081 365/154 |
| 7,944,734 B2 | 5/2011 | Lamorey | |
| 8,194,438 B2 * | 6/2012 | Ahn | G11C 11/412 365/154 |
| 8,508,983 B2 * | 8/2013 | Wang | G11C 14/0054 365/148 |
| 8,576,628 B2 | 11/2013 | Ueda | |
| 8,605,490 B2 * | 12/2013 | Fackenthal | G11C 14/009 365/148 |
| 9,099,181 B2 * | 8/2015 | Ong | G11C 14/0081 |

OTHER PUBLICATIONS

Fukumoto, K., et al., "A 256K-Bit Non-Volatile PSRAM With Page Recall and Chip Store", Sharp Corporation, IC Group, IEEE, 1991 Symposium on VLSI Circuits, Digest of Technical Papers, May 30-Jun. 1, 2991, pp. 91-92.

Tanaka et al, "Normally-off type nonvolatile static random access memory with perpendicular spin torque transfer-1 magnetic random access memory cells and smallest number of transistors", Japanese Journal of Applied Physics 53, D2014, pp. 04EM07-1-04EM07-4.

Abe, Novel Hybrid DRAM/MRAM Design for Reducing Power of High Performance Mobile CPU, IEEE International Electron Devices Meeting, Dec. 10-13, 2012, pp. 10.5.1-10.5.4, San Francisco, CA.

* cited by examiner

*Primary Examiner* — Hien Nguyen

(57) ABSTRACT

A memory device includes a first select transistor having a first current electrode coupled to a first bit line, a control electrode and a second current electrode. A second select transistor has a first current electrode coupled to a second bit line, a control electrode and a second current electrode. A first bi-directional resistive element has a cathode coupled to the second current electrode of the first select transistor and an anode coupled to an internal node. A second bi-directional resistive element has a cathode coupled to the internal node and an anode coupled to the second current electrode of the second select transistor. A third transistor has a first current electrode coupled to a third bit line, a second current electrode coupled to the internal node, and a control electrode coupled to a word line.

20 Claims, 2 Drawing Sheets

PSEUDO SRAM USING RESISTIVE ELEMENTS FOR NON-VOLATILE STORAGE

BACKGROUND

1. Field of the Disclosure

The present disclosure relates in general to semiconductor memories, and more specifically to pseudo SRAM using resistive elements for non-volatile storage.

2. Description of the Related Art

Memories with resistive storage elements under development across the semiconductor industry are geared to replace conventional random access memory (RAM) and non-volatile memory devices. The resistive memory devices include magnetoresistive random access memory (MRAM), Resistive random-access memory (RRAM or ReRAM), and phase-change memory (PCM), among others. Most of the resistive memory devices are implemented in one transistor/one resistive element or one diode/one resistive element memory cell configurations, which require minimal cell area but exhibit relatively slow read and write performance (e.g., approximately 30 nanoseconds or more per operation). Thus, resistive memory devices are not a viable substitute for much of the static RAM in a higher performance system where read/write operations occur within a few clock cycles. It is also difficult to produce a reliable one transistor/one resistive element or one diode/one resistive element memory.

Memory cells with one transistor and one resistive element may eventually replace embedded flash on future SoCs, but it is desirable to use these same elements to replace the static random access memory (SRAM) as well. Potentially, less flash would be needed, or the system could use a more efficient architecture, if the 'fast' memory such as SRAM was also compact and non-volatile.

BRIEF DESCRIPTION OF THE DRAWINGS

The benefits, features, and advantages of the present disclosure will become better understood with regard to the following description, and accompanying drawings where.

DETAILED DESCRIPTION

Integrated circuit devices and methods are disclosed that utilize resistive storage elements operating as non-volatile storage and a pseudo-SRAM (PSRAM) memory cell with three transistors and one capacitor. Non-volatile resistive elements are coupled to the memory cell and are operable to store and restore the data in the PSRAM. One resistive element is in a high resistive state (HRS) while the other resistive element is in a low LRS, and the comparison of the two resistive elements produces a robust low or high logic state to be sensed. The memory cells include a series pair of resistive elements connected between select transistors. The elements are connected such that they can be 'programmed' to HRS and LRS simultaneously. The resistive elements are wired with opposite orientation to each other to enable transition from HRS to LRS for one resistive element and from LRS to HRS for the other resistive element, simultaneously.

Figure 1:
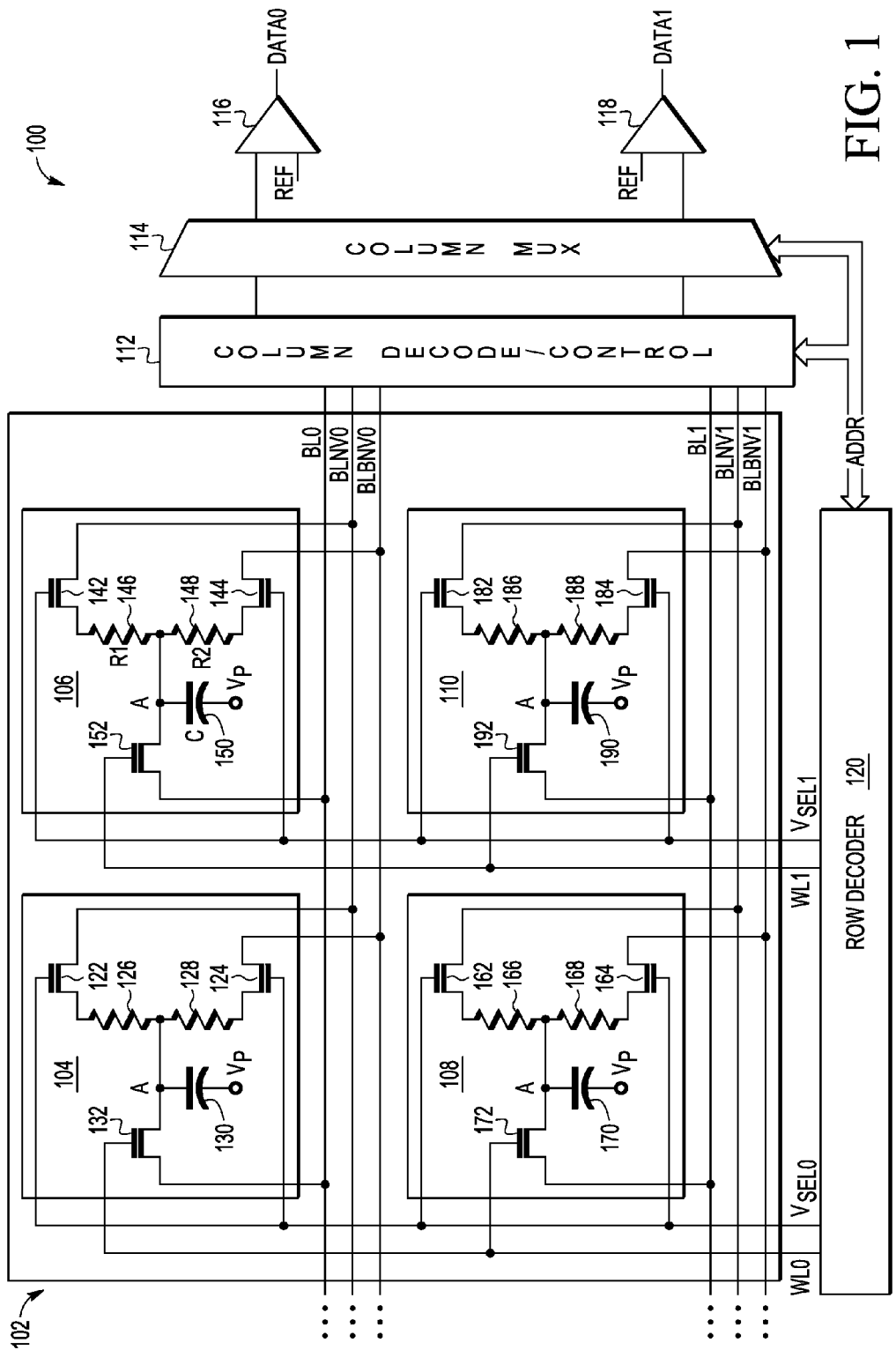
FIG. 1 is a schematic diagram of an integrated circuit device including a non-volatile memory (NVM) according to an embodiment.

FIG. 1 is a block diagram of an integrated circuit device including a memory device 100 according to an embodiment. Memory device 100 includes memory array 102 with a plurality of memory cells 104, 106, 108, 110 coupled to column decode/control 112, column multiplexer 114, sense amplifiers 116, 118, and row decoder 120. Sense amplifiers 116, 118 are coupled to column decode/control 112 by column multiplexer 114. Row decoder 120, column decode/control 112, and column multiplexer 114 can receive addresses for read and write requests from a computer processor (not shown). Data to be written to memory array 102 is provided from a processor to column decode/control 112. Select voltages VSEL0, VSEL1 and word lines $WL_0$, $WL_1$ are coupled between row decoder 120 and memory array 102.

A memory controller (not shown) controls program and erase procedures of the memory array 102 through row decoder 120 and column decode/control 112, such as in response to one or more processors. Data is written into or read from the memory array 102 via column decode/control 112.

Bit lines BL0-BL1, BLNV0-BLNV1, BLBNV0-BLBNV1, are coupled between memory array 102 and column decode/control 112, and between sense amplifiers 116, 118 and column decode/control 112 by way of column multiplexer 114. Sense amplifiers 116, 118 provide data (DATA0, DATA1) from respective columns of memory array 102 to one or more processors.

Although device 100 is shown with four memory cells 104-110, two word lines, two select voltages, and six bit lines, device 100 can include any suitable number of memory cells, select voltages, word lines and bit lines.

Memory device 100 may be implemented as part of a System On Chip (SOC) or the like which includes at least one processor coupled to the memory device 100 via an appropriate interface (not shown), such as a bus or the like with multiple signals or bits. The integrated circuit device may include other circuits, modules or devices, such as other memory devices (not shown), other functional modules (not shown), and external interfaces, such as input, output or input/output (I/O) ports or pins or the like (not shown). In one alternative embodiment, the memory device 100 is implemented alone in an integrated circuit without any other devices. In another alternative embodiment, memory device 100 is part of a larger system on the integrated circuit.

Memory cell 104 includes N-channel discharge or pull-down transistors 122, 124, two bidirectional resistive elements 126, 128, capacitor 130, and an N-channel access transistor 132. Access transistor 132 has a first current electrode coupled to bit line BL0, a second current electrode coupled to an anode terminal of resistive element 126 and a cathode terminal of resistive element 128, and a gate electrode coupled to word line WL0. Transistor 122 has a first current electrode coupled to bit line BLNV0, a second current electrode coupled to a cathode terminal of resistive element 126, and a gate electrode coupled to select voltage VSEL0. An anode terminal of resistive element 126 is coupled to a cathode terminal of resistive element 128 at Node A. Capacitor 130 has a first terminal coupled to Node A and a second terminal coupled to voltage Vp. Transistor 124 has a first current electrode coupled to complementary bit line BLBNV0, a second current electrode coupled to an anode terminal of resistive element 128, and a gate electrode coupled to select voltage VSEL0.

Memory cell 106 includes N-channel discharge or pull-down transistors 142, 144, two bidirectional resistive elements 146, 148, capacitor 150, and an N-channel access transistor 152. Access transistor 152 has a first current electrode coupled to bit line BL0, a second current electrode coupled to an anode terminal of resistive element 146 and a cathode terminal of resistive element 148, and a gate electrode coupled to word line WL1. Transistor 142 has a first current electrode coupled to bit line BLNV0, a second current electrode coupled to a cathode terminal of resistive element 146, and a gate electrode coupled to select voltage VSEL1. An anode terminal of resistive element 146 is coupled to a cathode terminal of resistive element 148 at Node A. Capacitor 150 has a first terminal coupled to Node A and a second terminal coupled to voltage Vp. Transistor 144 has a first current electrode coupled to complementary bit line BLBNV0, a second current electrode coupled to an anode terminal of resistive element 148, and a gate electrode coupled to select voltage VSEL1.

Memory cell 108 includes N-channel discharge or pull-down transistors 162, 164, two bidirectional resistive elements 166, 168, capacitor 170, and an N-channel access transistor 172. Access transistor 172 has a first current electrode coupled to bit line BL1, a second current electrode coupled to an anode terminal of resistive element 166 and a cathode terminal of resistive element 168, and a gate electrode coupled to word line WL0. Transistor 162 has a first current electrode coupled to bit line BLNV1, a second current electrode coupled to a cathode terminal of resistive element 166, and a gate electrode coupled to select voltage VSEL0. An anode terminal of resistive element 166 is coupled to a cathode terminal of resistive element 168 at Node A. Capacitor 170 has a first terminal coupled to Node A and a second terminal coupled to voltage Vp. Transistor 164 has a first current electrode coupled to complementary bit line BLBNV1, a second current electrode coupled to an anode terminal of resistive element 168, and a gate electrode coupled to select voltage VSEL0.

Memory cell 110 includes N-channel discharge or pull-down transistors 182, 184, two bidirectional resistive elements 186, 188, capacitor 190, and an N-channel access transistor 192. Access transistor 192 has a first current electrode coupled to bit line BL1, a second current electrode coupled to an anode terminal of resistive element 186 and a cathode terminal of resistive element 188, and a gate electrode coupled to word line WL1. Transistor 182 has a first current electrode coupled to bit line BLNV1, a second current electrode coupled to a cathode terminal of resistive element 186, and a gate electrode coupled to select voltage VSEL1. An anode terminal of resistive element 186 is coupled to a cathode terminal of resistive element 188 at Node A. Capacitor 190 has a first terminal coupled to Node A and a second terminal coupled to voltage Vp. Transistor 184 has a first current electrode coupled to complementary bit line BLBNV1, a second current electrode coupled to an anode terminal of resistive element 188, and a gate electrode coupled to select voltage VSEL1.

Bi-directional resistive elements 126/128, 146/148, 166/168 and 186/188 are used as nonvolatile storage for the data in memory cells 104-110. The cathode of resistive elements 126, 146, 166, 186 is connected to a respective one of bit lines BLNV0, BLNV1 when respective transistors 122, 142, 162, 182 are in conducting mode, while the anode of resistive elements 128, 148, 168, 188 is connected to a respective one of bit lines BLBNV0, BLBNV1 when respective transistors 124, 144, 164, 184 are in conducting mode. As used here, the term 'anode' refers to the node which is biased positive to switch from a high resistive state (HRS) to a low resistive state (LRS). If storage node A is pulled to ground when a respective bit lines BL0, BL1, BLNV0, BLNV1, BLBNV0, BLBNV1 and word lines WL0, WL1 are asserted, resistive elements 126, 146, 166, 186 will be biased to switch from HRS to LRS, while resistive elements 128, 148, 168, 188 will switch from LRS to HRS. The anode and cathode terminals of each pair of resistive elements 126/128, 146/148, 166/168 and 186/188 can be swapped, and the cells 104-110 will function in a similar manner, except that the logical value stored in the cells 104-110 will be inverted.

Note that during normal PSRAM or DRAM operation, transistors 122/124, 142/144, 162/164 and 182/184 can be placed in non-conducting mode to prevent the changing of the state of node A due to the resistive elements 126/128, 146/148, 166/168 and 186/188. Node A will be high when the memory cell 104, 106, 108, 110 including respective capacitors 130, 150, 170, 190 stores a "1" or high value.

Figure 2:
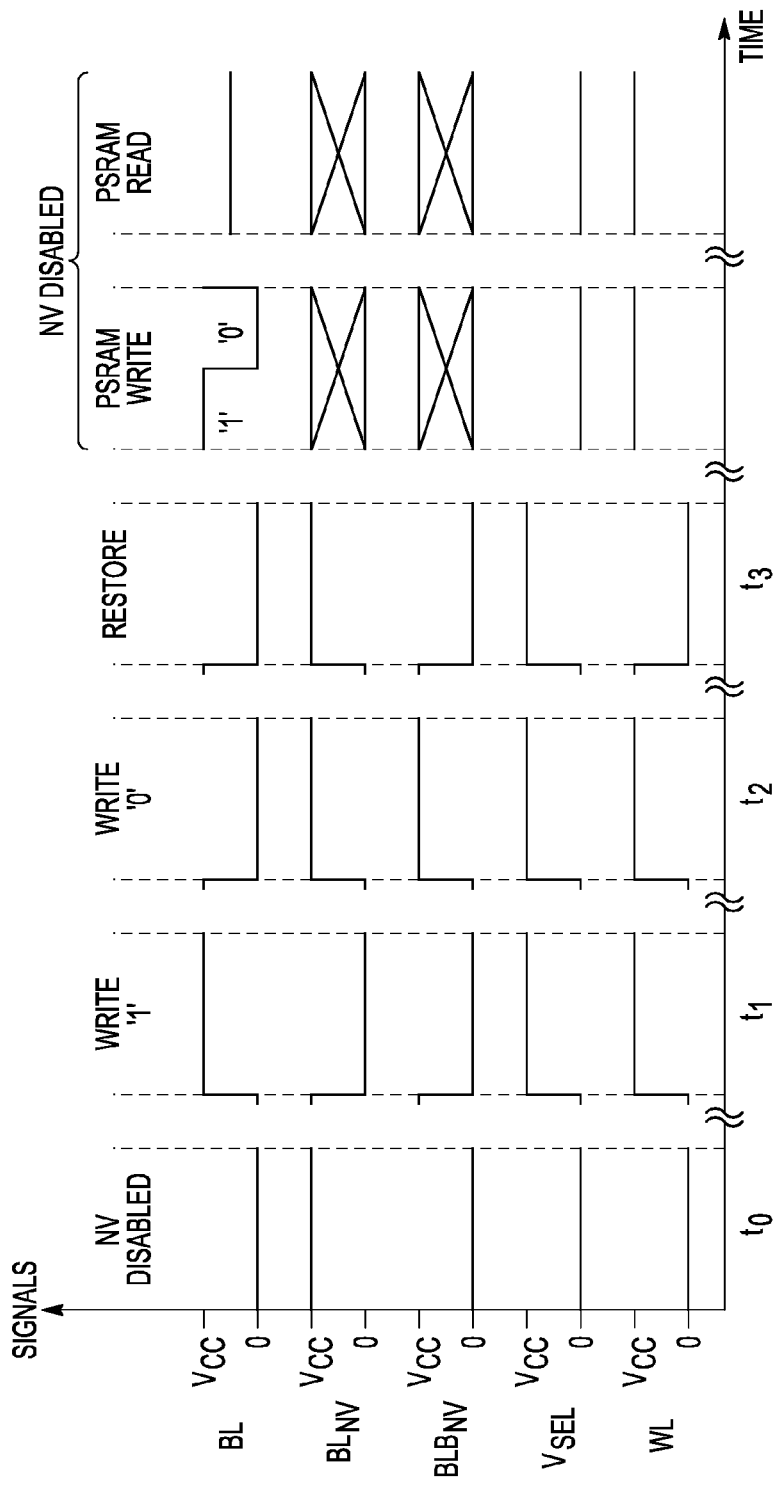
FIG. 2 is a timing diagram showing states of signals in a memory cell in the memory array of FIG. 1 during a non-volatile elements disabled state and in write and read operations in accordance with one embodiment.

FIG. 2 is a timing diagram showing states of signals in memory cell 104 in the memory array 102 of FIG. 1 during write and read operations and in a non-volatile (NV) disabled state in accordance with one embodiment.

To write a "1" in resistive elements of selected memory cell 104, FIG. 2 shows the bit line (BL0), word line (WL0) and select voltage VSEL0 are asserted high, while bit lines BLNV0 and BLBNV0 are low. This will switch resistive element 126 from HRS to LRS, and resistive element 128 from LRS to HRS.

To write a "0" in a selected memory cell 104, bit line BL0 is low while word line WL0, NV bit line BLNV0, complementary NV bit line BLBNV0, and select voltage VSEL0 are high. Resistive element 126 switches from LRS to HRS, and resistive element 128 switches from HRS to LRS. The data storage state is determined by the voltage divider created by the two resistive elements 126, 128. Typically, the ratio of resistance in the HRS compared to the LRS is between 5 to 10, so if BLNV0 and BLBNV0 are biased to 1V/0V, the internal node will float to less than 200 milliVolt or greater than 800 milliVolt, depending on which resistive element 126, 128 is in the LRS and which is in the HRS. Since the voltage at node A is related to the ratio R2/(R1+R2) and is not dependent on an RC constant in the high resistance state, there is a wider choice of process windows for manufacturing resistive elements 126, 128.

To restore the data in resistive elements 126, 128 to capacitor 130, voltage on bit line BL0, non-volatile complementary bit line BLBNV0 and word line WL0 are set low while the voltage on non-volatile bit line BLNV0 and select voltage VSEL0 are set high. A regulated voltage is also supplied at the gate electrodes of transistors 122, 124 to ensure read disturb immunity. The voltage at node A goes high if a "1" is being stored, which means resistive element 126 is in the LRS and resistive element 128 is in the HRS. Conversely, the voltage at node A goes low if a "0" is being stored, which means resistive element 126 is in the HRS and resistive element 128 is in the LRS.

In either case of writing a "1" or a "0" to memory cell 104, the write operations can be performed relatively quickly by disabling the non-volatile portion of memory cell 104, charging up capacitor 130 and then transferring the data to resistive elements 126, 128 at a later time. As shown in FIG. 2 for the PSRAM write section with the non-volatile portion disabled, bit line BL0 and word line WL0 are set high to write a "1" with select voltage VSEL0 low and non-volatile bit line BLNV0 and complementary non-volatile bit line BLBNV0 left floating. To write a zero with the non-volatile portion disabled, the bit line BL0 is set low while the word line WL0 is high, with select voltage VSEL0 low and non-volatile bit line BLNV0 and complementary non-volatile bit line BLBNV0 left floating.

To perform a read operation with the non-volatile portion of memory cell 104 disabled, the bit line BL0 is set high while the word line WL0 is high, with select voltage VSEL0 low and non-volatile bit line BLNV0 and complementary non-volatile bit line BLBNV0 left floating.

Note that transistor 132 will draw current only through the selected memory cell 104 during all operations. Neighboring memory cells 106-110 are therefore not affected by operations on memory cell 104. Additionally, the layout area requirements for cells 104-110 are comparable to the area required for conventional SRAM cells while providing non-volatility. Memory cells 104-110 can be used in extremely low power modes since the resistive elements 126/128, 146/148, 166/168 and 186/188 retain the data while not powered, and thus do not draw refresh current.

By now it should be appreciated that in some embodiments, a memory device can comprise a first select transistor having a first current electrode coupled to a first bit line (BLNV0), a control electrode and a second current electrode. A second select transistor has a first electrode coupled to a second bit line (BLBNV0), a control electrode and a second current electrode. A first bi-directional resistive element (126) has a cathode coupled to the second current electrode of the first select transistor (122) and an anode coupled to an internal node. A second bi-directional resistive element (128) has a cathode coupled to the internal node and an anode coupled to the second current electrode of the second select transistor (124). A third transistor (132) has a first current electrode coupled to a third bit line (BL0), a second current electrode coupled to the internal node, and a control electrode coupled to a word line.

In another aspect, when the first bi-directional resistive element is in a low resistance state, the second bi-directional resistive element is in a high resistance state, the first and second select transistors are in a conductive state, the third transistor is in a conductive state, and voltage at the first and second bit lines is less than a predetermined value, and the voltage at the third bit line is greater than a predetermined value, and the voltage at the third bit line is greater than a predetermined value, the memory cell can store a high logic state during a write operation.

In another aspect, when the first bi-directional resistive element is in a high resistance state, the second bi-directional resistive element is in a low resistance state, the first and second select transistors are in a conductive state, the third transistor is in a conductive state, and voltage at the first and second bit lines is greater than a predetermined value, and the voltage at the third bit line is less than a predetermined value, the memory cell can store a low logic state during a write operation.

In another aspect, the memory device can further comprise a capacitor (130) having a first terminal coupled to the second current electrode of the third transistor and the internal node, and a second terminal coupled to a plate voltage (Vp).

In another aspect, the ratio of high resistance to low resistance can range between 5 and 10 for the first and second bi-directional resistive elements.

In another aspect, when the first bi-directional resistive element is in a low resistance state, the second bi-directional resistive element is in a high resistance state, the first and second select transistors are in a conductive state, the third transistor is in a non-conductive state, voltage at the first bit line is greater than a predetermined value, and voltage at the second bit line is less than a predetermined value, the capacitor can be charged to a high value during a restore operation.

In another aspect, when the first bi-directional resistive element is in a high resistance state, the second bi-directional resistive element is in a low resistance state, the first and second select transistors are in a conductive state, the third transistor is in a non-conductive state, voltage at the first bit line is greater than a predetermined value, and voltage at the second bit line is less than a predetermined value, the capacitor can be discharged to a low value during a restore operation.

In another aspect, the first and second bi-directional resistive elements and the first and second select transistors can be included in a non-volatile portion of the memory device, the third transistor and the capacitor can be included in a volatile portion of the memory device, and during a write operation to the volatile portion, the third transistor can couple the third bit line (BL0) to the internal node. When a voltage at the internal node is at least a predetermined amount less than a voltage of the third bit line, a first logic state can be written to the volatile portion and when the voltage at the internal node can be at least the predetermined amount greater than the voltage of the third bit line, a second logic state can be written to the volatile portion.

In another aspect, during a read operation of the volatile portion, the third transistor can be in a conducting state and voltage sensed at the third bit line indicates whether the capacitor is in a high state or a low state.

In another embodiment, a method of operating can comprise restoring data from the non-volatile portion to the volatile portion including biasing the first and second bi-directional resistive elements in series between the first bit line and the second bit line, and writing data in the non-volatile portion including biasing the first and second bi-directional resistors in parallel between the first and second bit lines. The memory cell can have a volatile portion and a non-volatile portion, the non-volatile portion including a first bi-directional resistive element having a cathode coupled to a first bit line and an anode coupled to an internal node, and a second bi-directional resistive element having a cathode coupled to the internal node and an anode coupled to a second bit line.

In another aspect, during the restoring, biasing the first and second bi-directional resistive elements in series between the first bit line and the second bit line can include setting a first voltage on the first bit line to a value greater than a second voltage on the second bit line.

In another aspect, during the writing, a first state can be written when the first bi-directional resistive element is in a low resistance state and the second bi-directional resistive element is a high resistance state.

In another aspect, during the writing, a second state can be written when the first bi-directional resistive element is in a high resistance state and the second bi-directional resistive element is a low resistance state.

In another aspect, a ratio of resistance between a high resistive state and a low resistive state for the first and second bi-directional resistive elements can be between 5 and 10.

In another aspect, the method can further comprise sensing a third bit line coupled to the volatile portion to determine a logic state stored in the volatile portion.

In still another embodiment, an integrated circuit device (100) can comprise an array of memory cells (102), wherein each memory cell can comprise a non-volatile portion including: a first transistor (122) having a control electrode coupled to a select voltage, a first current electrode, and a second current electrode coupled to a first bit line; a second transistor (124) having a control electrode coupled to the select voltage, a first current electrode, and a second current electrode coupled to a second bit line. A first bi-directional resistive element (126) can have a cathode coupled to the second current electrode of the first transistor and an anode coupled to an internal node. A second bi-directional resistive element (128) can have a cathode coupled to the internal node and an anode coupled to the second current electrode of the second transistor. A volatile portion of each memory cell can include a third transistor (132) having a first current electrode coupled to a third bit line, a control electrode coupled to a word line, and a second current electrode coupled to the internal node. A capacitor can be coupled to the second current electrode of the third transistor and the internal node. Column decode and sense circuitry (112) can be coupled to the first, second and third bit lines of each memory cell of the array of memory cells. Row decode circuitry (120) can be coupled to the select voltage and the word lines of each memory cell of the array of memory cells.

In another aspect, during a read operation of the volatile portion, for each memory cell coupled to an activated word line, the third transistor can be configured to draw current from the third bit line based on a charge state of the capacitor.

In another aspect, during a first write operation, the non-volatile portion can store a high state when the first and second bi-directional elements are biased in parallel, the first bi-directional resistive element is in a low resistive state, and the second bi-directional resistive element is in a high resistive state.

In another aspect, during a second write operation, the non-volatile portion can store a low state when the first and second bi-directional elements are biased in parallel, the first bi-directional resistive element is in a high resistive state, and the second bi-directional resistive element is in a low resistive state.

In another aspect, during a restore operation, the non-volatile portion can store a high state when the first and second bi-directional elements are biased in series, the first bi-directional resistive element is in a low resistive state, and the second bi-directional resistive element is in a high resistive state.

This disclosure is presented to enable one of ordinary skill in the art to make and use the present disclosure as provided within the context of a particular application and its requirements. Various modifications to the preferred embodiments will, however, be apparent to one skilled in the art, and the general principles defined herein may be applied to other embodiments. Therefore, the present disclosure is not intended to be limited to the particular embodiments shown and described herein, but is to be accorded the widest scope consistent with the principles and novel features herein disclosed.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of systems disclosed herein are circuitry located on a single integrated circuit or within a same device. Alternatively, the systems may include any number of separate integrated circuits or separate devices interconnected with each other. Also for example, a system or portions thereof may be soft or code representations of physical circuitry or of logical representations convertible into physical circuitry. As such, a system may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the present disclosure has been described in considerable detail with reference to certain preferred versions thereof, other versions and variations are possible and contemplated. Those skilled in the art should appreciate that they can readily use the disclosed conception and specific embodiments as a basis for designing or modifying other structures for carrying out the same purposes of the present disclosure without departing from the scope of the disclosure as defined by the appended claims.

What is claimed is:

1. A memory device comprising:
   a first select transistor having a first current electrode coupled to a first bit line, a control electrode and a second current electrode;
   a second select transistor having a first current electrode coupled to a second bit line, a control electrode and a second current electrode;
   a first bi-directional resistive element having a cathode coupled to the second current electrode of the first select transistor and an anode coupled to an internal node;
   a second bi-directional resistive element having a cathode coupled to the internal node and an anode coupled to the second current electrode of the second select transistor;
   a third transistor having a first current electrode coupled to a third bit line (BL0), a second current electrode coupled to the internal node, and a control electrode coupled to a word line.

2. The memory device of claim 1, wherein when the first bi-directional resistive element is in a low resistance state, the second bi-directional resistive element is in a high resistance state, the first and second select transistors are in a conductive state, the third transistor is in a conductive state, and voltage at the first and second bit lines is less than a predetermined value, and the voltage at the third bit line is greater than a predetermined value, the memory cell stores a high logic state during a write operation.

3. The memory device of claim 1, wherein when the first bi-directional resistive element is in a high resistance state, the second bi-directional resistive element is in a low resistance state, the first and second select transistors are in a conductive state, the third transistor is in a conductive state, and voltage at the first and second bit lines is greater than a predetermined value, and the voltage at the third bit line is less than a predetermined value, the memory cell stores a low logic state during a write operation.

4. The memory device of claim 1, further comprising:
   a capacitor having a first terminal coupled to the second current electrode of the third transistor and the internal node, and a second terminal coupled to a plate voltage.

5. The memory device of claim 4, further comprising:
   the ratio of high resistance to low resistance ranges between 5 and 10 for the first and second bi-directional resistive elements.

6. The memory device of claim 5, wherein, when the first bi-directional resistive element is in a low resistance state, the second bi-directional resistive element is in a high resistance state, the first and second select transistors are in a conductive state, the third transistor is in a non-conductive state, voltage at the first bit line is greater than a predetermined value, and voltage at the second bit line is less than a predetermined value, the capacitor is charged to a high value during a restore operation.

7. The memory device of claim 5, wherein, when the first bi-directional resistive element is in a high resistance state, the second bi-directional resistive element is in a low resistance state, the first and second select transistors are in a conductive state, the third transistor is in a non-conductive state, voltage at the first bit line is greater than a predetermined value, and voltage at the second bit line is less than a predetermined value, the capacitor is discharged to a low value during a restore operation.

8. The memory device of claim 4, wherein
the first and second bi-directional resistive elements and the first and second select transistors are included in a non-volatile portion of the memory device,
the third transistor and the capacitor are included in a volatile portion of the memory device, and
during a write operation to the volatile portion, the third transistor couples the third bit line to the internal node, wherein when a voltage at the internal node is at least a predetermined amount less than a voltage of the third bit line, a first logic state is written to the volatile portion and when the voltage at the internal node is at least the predetermined amount greater than the voltage of the third bit line, a second logic state is written to the volatile portion.

9. The memory device of claim 8, wherein during a read operation of the volatile portion, the third transistor is in a conducting state and voltage sensed at the third bit line indicates whether the capacitor is in a high state or a low state.

10. A method of operating a memory cell having a volatile portion and a non-volatile portion, the non-volatile portion including a first bi-directional resistive element having a cathode coupled to a first bit line and an anode coupled to an internal node, and a second bi-directional resistive element having a cathode coupled to the internal node and an anode coupled to a second bit line, the method comprising:
restoring data from the non-volatile portion to the volatile portion including biasing the first and second bi-directional resistive elements in series between the first bit line and the second bit line; and
writing data in the non-volatile portion including biasing the first and second bi-directional resistors in parallel between the first and second bit lines.

11. The method of claim 10, wherein, during the restoring, the biasing the first and second bi-directional resistive elements in series between the first bit line and the second bit line includes setting a first voltage on the first bit line to a value greater than a second voltage on the second bit line.

12. The method of claim 10, wherein, during the writing, a first state is written when the first bi-directional resistive element is in a low resistance state and the second bi-directional resistive element is a high resistance state.

13. The method of claim 12, wherein during the writing, a second state is written when the first bi-directional resistive element is in a high resistance state and the second bi-directional resistive element is a low resistance state.

14. The method of claim 10, wherein a ratio of resistance between a high resistive state and a low resistive state for the first and second bi-directional resistive elements is between 5 and 100.

15. The method of claim 10, further comprising, sensing a third bit line coupled to the volatile portion to determine a logic state stored in the volatile portion.

16. An integrated circuit device comprising:
an array of memory cells, wherein each memory cell comprises:
a non-volatile portion including:
a first transistor having a control electrode coupled to a select voltage, a first current electrode, and a second current electrode coupled to a first bit line;
a second transistor having a control electrode coupled to the select voltage, a first current electrode, and a second current electrode coupled to a second bit line;
a first bi-directional resistive element having a cathode coupled to the second current electrode of the first transistor and an anode coupled to an internal node; and
a second bi-directional resistive element having a cathode coupled to the internal node and an anode coupled to the second current electrode of the second transistor;
a volatile portion including:
a third transistor having a first current electrode coupled to a third bit line, a control electrode coupled to a word line, and a second current electrode coupled to the internal node; and
a capacitor coupled to the second current electrode of the third transistor and the internal node;
column decode and sense circuitry coupled to the first, second and third bit lines of each memory cell of the array of memory cells; and
row decode circuitry coupled to the select voltage and the word lines of each memory cell of the array of memory cells.

17. The device of claim 16, wherein, during a read operation of the volatile portion, for each memory cell coupled to an activated word line, the third transistor is configured to draw current from the third bit line based on a charge state of the capacitor.

18. The device of claim 16, wherein during a first write operation, the non-volatile portion stores a high state when the first and second bi-directional elements are biased in parallel, the first bi-directional resistive element is in a low resistive state, and the second bi-directional resistive element is in a high resistive state.

19. The device of claim 18, wherein during a second write operation, the non-volatile portion stores a low state when the first and second bi-directional elements are biased in parallel, the first bi-directional resistive element is in a high resistive state, and the second bi-directional resistive element is in a low resistive state.

20. The device of claim 16, wherein during a restore operation, the non-volatile portion stores a high state when the first and second bi-directional elements are biased in series, the first bi-directional resistive element is in a low resistive state, and the second bi-directional resistive element is in a high resistive state.

* * * * *